United States Patent
Kim et al.

(10) Patent No.: US 9,373,393 B2
(45) Date of Patent: Jun. 21, 2016

(54) RESISTIVE MEMORY DEVICE IMPLEMENTING SELECTIVE MEMORY CELL REFRESH

(71) Applicant: Integrated Silicon Solution, Inc., Milpitas, CA (US)

(72) Inventors: Justin Kim, Seongnam (KR); Geun-Young Park, Milpitas, CA (US); Seong Jun Jang, Milpitas, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 14/297,454

(22) Filed: Jun. 5, 2014

(65) Prior Publication Data

US 2015/0357035 A1    Dec. 10, 2015

(51) Int. Cl.
*G11C 13/00* (2006.01)

(52) U.S. Cl.
CPC .......... *G11C 13/0033* (2013.01); *G11C 13/004* (2013.01)

(58) Field of Classification Search
CPC ........................ G11C 13/0033; G11C 13/004
USPC ....................................................... 365/148
See application file for complete search history.

(56) References Cited

U.S. PATENT DOCUMENTS

| | | | |
|---|---|---|---|
| 7,539,050 B2 | 5/2009 | Philipp et al. | |
| 7,894,254 B2 * | 2/2011 | Lung .................. | G11C 11/5678 365/148 |
| 8,045,361 B2 | 10/2011 | Lee et al. | |
| 8,351,245 B2 | 1/2013 | Ma et al. | |
| 8,559,253 B2 | 10/2013 | Kitagawa et al. | |
| 2002/0018361 A1 * | 2/2002 | Hoffmann .............. | G11C 11/16 365/158 |
| 2010/0085796 A1 * | 4/2010 | Zhu ........................ | G11C 11/16 365/148 |
| 2012/0063196 A1 * | 3/2012 | Kim .................... | G11C 13/0004 365/148 |
| 2012/0163065 A1 * | 6/2012 | Chen ...................... | G11C 11/16 365/148 |
| 2012/0314478 A1 | 12/2012 | Ha et al. | |
| 2013/0229861 A1 * | 9/2013 | Ueda .................. | G11C 11/1673 365/158 |
| 2013/0235648 A1 | 9/2013 | Kim et al. | |
| 2013/0250653 A1 * | 9/2013 | Ueda ..................... | G11C 11/16 365/148 |
| 2013/0279243 A1 | 10/2013 | Huang | |
| 2014/0092670 A1 | 4/2014 | Cosemans | |
| 2014/0098592 A1 | 4/2014 | Lee | |

* cited by examiner

*Primary Examiner* — Hoai V Ho
*Assistant Examiner* — Muna A Techane
(74) *Attorney, Agent, or Firm* — Van Pelt, Yi & James LLP

(57) ABSTRACT

A resistive memory device implements a selective refresh operation in which only memory cells with reduced sense margin are refreshed. In some embodiments, the selective refresh operation introduces a sense margin guardband so that a memory cell having programmed resistance that falls within the sense margin guardband will be refreshed during the read operation. The selective refresh operation is performed transparently at each read cycle of the memory cells and only memory cells with reduced sense margins are refreshed.

7 Claims, 8 Drawing Sheets

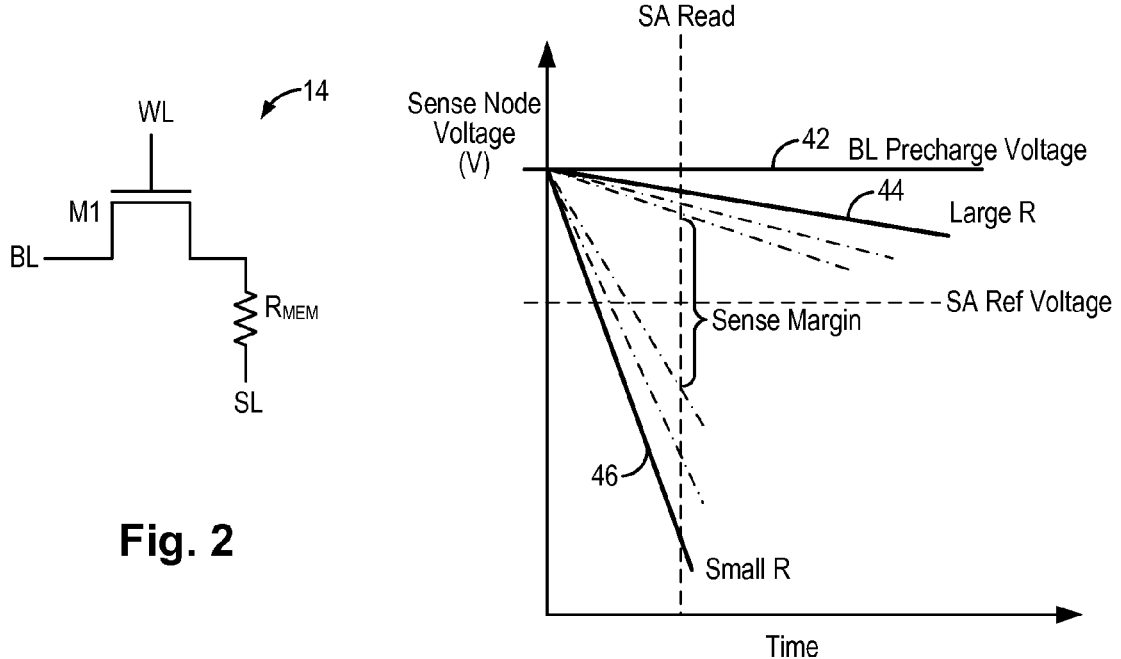
Fig. 2
Fig. 3
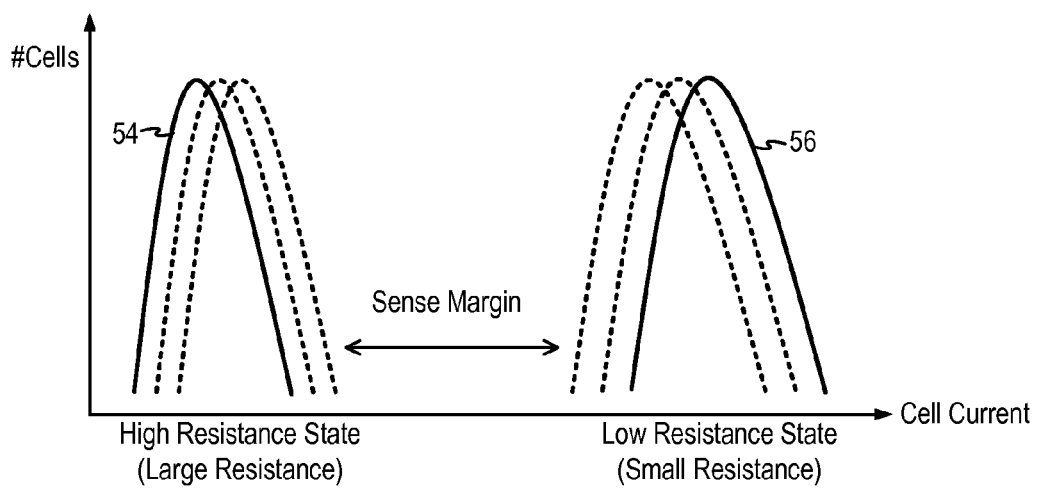
Fig. 4

RESISTIVE MEMORY DEVICE IMPLEMENTING SELECTIVE MEMORY CELL REFRESH

BACKGROUND OF THE INVENTION

Resistive random-access memory (RRAM or "resistive memory") is a type of non-volatile memory where the data storage function is implemented in a variable resistance element whose resistance value can change between a low level and a high level. For example, most resistive memory devices include as the variable resistance element a controllable resistor material between upper and lower conductive electrodes. The controllable resistor material may be a transition metal oxide or other suitable materials. A conductive path is created or dissolved in the controllable resistor material, corresponding to low-resistive and high-resistive states. A resistive memory cell in a resistive memory device typically includes a variable-resistance resistive memory element connected serially with a switching device acting as a cell selector. The switching device is typically an NMOS transistor.

In some examples, a resistive memory cell can store one logical state by programming the resistive memory element to have a relatively large resistance. The resistive memory cell can store a second logical state by programming the resistive memory element to have a relatively small resistance. However, due to limitations in the fabrication process, the resistance values for the high and low resistance levels are often distributed over a range. Furthermore, the resistance values for the high and low resistance levels often vary over time.

Resistive memory devices have advantages over existing memory devices, such as DRAM, for their low operating current, fast access time, and long data retention. Furthermore, resistive memory devices are attractive as replacement for existing memory devices because of their compatibility with existing CMOS fabrication technologies.

BRIEF DESCRIPTION OF THE DRAWINGS

Various embodiments of the invention are disclosed in the following detailed description and the accompanying drawings.

FIG. 2 is a schematic diagram of a resistive memory cell in the resistive memory device in some examples of the present invention.

FIG. 3 is a plot of the sense node voltage of a resistive memory during the read operation in some example.

FIG. 4 is a plot of the cell current distribution for high and low resistance states in a resistive memory device in some example.

FIG. 5(a) and FIG. 5(b), is a plot of the sense node voltage distribution for high and low resistance states in a resistive memory device implementing the selective refresh method in some embodiments of the present invention.

FIG. 7(a), is a schematic diagram of a resistive memory device incorporating a selective refresh circuit in embodiments of the present invention.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a resistive memory device implements a selective refresh operation in which only memory cells with reduced sense margin are refreshed. In some embodiments, the selective refresh operation introduces a sense margin guardband so that a memory cell having programmed resistance that falls within the sense margin guardband will be refreshed during the read operation. Furthermore, the selective refresh operation is performed transparently at each read cycle of the memory cells and only memory cells with reduced sense margins are refreshed. The selective refresh operation guardbands the sense margin of the resistive memory cells to improve the robustness of the stored memory data. Accurate and reliable data storage is ensured for all memory cells without having to perform blanket refresh.

Figure 1:
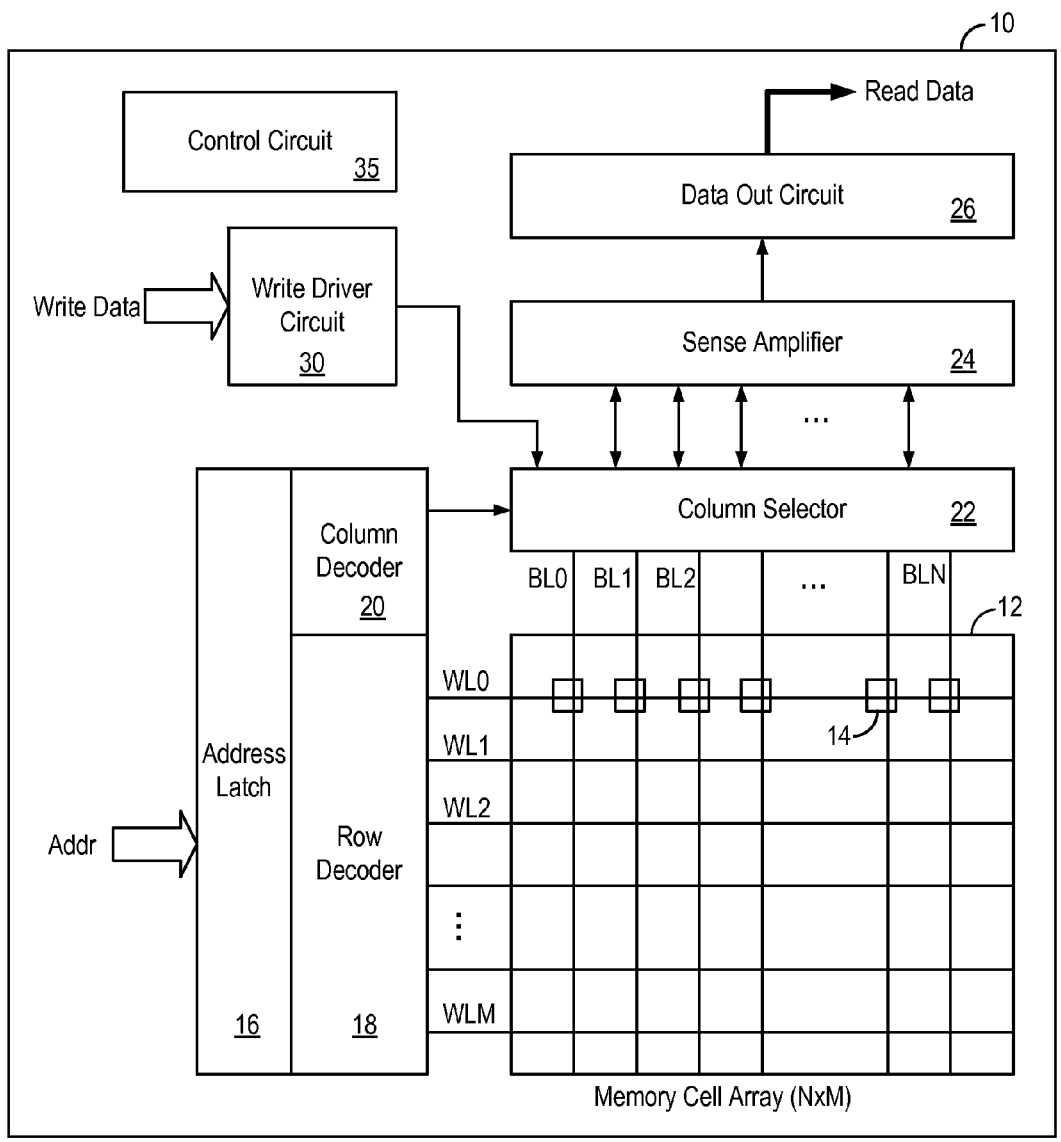
FIG. 1 is a block diagram of a resistive memory device in one exemplary embodiment.

FIG. 1 is a block diagram of a resistive memory device in one exemplary embodiment. FIG. 1 is illustrative only and the resistive memory device may include additional components not shown in FIG. 1. Referring to FIG. 1, the resistive memory device 10 includes a two-dimensional array 12 of resistive memory cells 14. The cell array 12 is addressed by a row decoder 18 and a column decoder 20 to selectively access the resistive memory cells 14 for read and write operations. In some cases, a refresh operation may be performed to preserve the stored data. In particular, an address Addr is received at an address latch 16 and the received address is decoded by the row decoder 18 which selects the word lines and the column decoder 20 which selects the bit lines of the memory array 12. The resistor memory cells 14 in the array 12 are accessed by word lines WL0 to WLM and bit lines BL0 and BLN. In conventional operation, the row decoder 18 selectively activates a word line from WL0 to WLM. The column decoder selectively activates a bit line from BL0 to BLN through the column selector circuit 22 to allow a resistive memory cell 14 at the intersection of the selected word line and selected bit line to be accessed.

To read data from the memory array 12, the column selector circuit 22 connects the bit lines to a sense amplifier circuit 24. The sense amplifier output is connected to a data out circuit 26 to provide read data as the output data of the resistive memory device 10. To write data to the memory array 12, the column selector circuit 22 connects the bit lines to a write driver circuit 30 which is configured to receive write data. In practice, the write driver circuit 30 and the sense amplifier circuit 24 includes a bank of write drivers and a bank of sense amplifiers, one set of write driver and one set of sense amplifier for each input/output (I/O) of the flash memory device. Each set of write driver and sense amplifier is coupled to a block of memory cells 14 in the cell array 12. For example, when the resistive memory device 10 generates output data in K-bit (i.e. K-bit I/O), the write driver circuit 30 and the sense amplifier circuit 24 may include K write drivers and K sense amplifiers, each write driver circuit and each sense amplifier circuit being coupled to a block of bits lines associated with a databit of the output data. A control circuit 35 controls the operation and the mode configuration of the resistive memory device 10. The memory architecture shown in FIG. 1 is illustrative only and it will be appreciated that the structure and methods described herein may be utilized in other memory architectures.

In the present embodiment, resistive memory cells 14 are implemented using a metal-controllable-resistor-metal structure where the controllable resistor material as the resistive memory element is formed between upper and lower conductive electrodes. The controllable resistor material has variable resistance and can be programmed to a high resistance state or a low resistance state. FIG. 2 is a schematic diagram of a resistive memory cell in the resistive memory device in some examples of the present invention. Referring to FIG. 2, a resistive memory cell 14 includes a resistive memory element denoted as a resistor $R_{MEM}$ connected in series with a switching device M1 acting as a cell selector. In the present example, the switching device M1 is an NMOS transistor. The drain terminal of the cell selector transistor M1 is coupled to the bit line BL, the gate terminal of the cell selector transistor M1 is coupled to the word line WL. The resistive memory element $R_{MEM}$ is connected in series with the source terminal of the cell selector transistor M1. The other end of the resistive memory element $R_{MEM}$ is the source line SL of the cell array 12. In operation, the source line SL of the cell array may be connected to different voltage potential to facilitate the writing, reading and refreshing of the memory content. In some embodiments, the resistive memory element $R_{MEM}$ is formed using carbon nanotubes.

In some embodiments, the resistive memory cell may be configured to store a logical high value (logical "1") by programming the resistive memory element to have a relatively large resistance ($R_{SET}$). In the present description, the logical high or "1" state of the resistive memory cell may be referred to as a "set" state. The resistive memory cell may also be configured to store a logical low value (logical "0") by programming the resistive memory element to have a relatively small resistance ($R_{RESET}$). In the present description, the logical low or "0" state of the resistive memory cell may be referred to as a "reset" state. Thus, the resistive memory element $R_{MEM}$ may have a small resistance value in the reset state and a large resistance value in the set state. It is understood that resistive memory cells may be constructed to operate in the opposite resistance states in other configurations of the resistive memory device. That is, the resistive memory element $R_{MEM}$ may have a large resistance value in the reset state (logical low) and a small resistance value in the set state (logical high) in other embodiments.

In general, a resistive memory cell is said to be in a high resistance state when the memory cell has a large resistance value and a resistive memory cell is said to be in a low resistance state when the memory cell has a small resistance value. The high and low resistance states can be assigned to either of the logical low or logical high states.

To write data to a resistive memory cell, a word line is activated by the row address and a bit line is selected by the column selector in response to a column address. The write driver circuit 30 receives the input write data and generate a write pulse in response to the write data. The write pulse is coupled to the bit line BL of the memory cell. Meanwhile, the source line SL of the resistive memory cell is biased to a selected level in response to the write data. The resistive memory element of the selected resistive memory cell is then programmed to a specific resistance value in response to the write data. In particular, to program the resistive memory cell to a low resistance state, a write pulse having a logical high value (e.g. the positive power supply voltage) is provided to the bit line BL while the source line SL is biased to the ground potential or a negative voltage value $V_{SL-GND}$. On the other hand, to program the resistive memory cell to a high resistance state, a write pulse having a logical low value (e.g. ground) is provided to the bit line BL while the source line SL is biased to a positive voltage value $V_{SL-VDD}$.

To read data stored from a resistive memory cell, the programmed resistance value of a resistive memory cell can be determined by comparing the programmed resistance to a reference resistance. In practice, the resistance value of the resistive memory cell may be detected by measuring a cell current that flows through the resistive memory element when the cell selector transistor M1 is turned on. The cell current value is directly related to the programmed resistance value of the memory cell. More specifically, the cell current value is inversely proportional to the programmed resistance value of the memory cell. Accordingly, when the memory cell is programmed to a large resistance value, the cell current is small. Meanwhile, when the memory cell is programmed to a small resistance value, the cell current is large. Thus, the programmed resistance value of a resistive memory cell can be determined by comparing the cell current to a reference current. In some embodiments, the cell current is used to develop a voltage at a sense node. The sense node voltage, being indicative of the cell current, is measured and compared to a reference voltage to determine the programmed resistance of the resistive memory cell.

In one example, the read operation for a resistive memory cell will be described with reference to FIGS. 3 and 4. FIG. 3 is a plot of the sense node voltage of a resistive memory during the read operation in some example. FIG. 4 is a plot of the cell current distribution for high and low resistance states in a resistive memory device in some example. When a resistive memory cell is selected for read out, a bit line associated with the selected memory cell is selected by the column selector in response to the column address. The selected bit line is precharged to a precharge voltage level (curve 42). Meanwhile, the source line SL of the resistive memory cell is connected to the ground potential. Then, the word line is activated by the row address associated with the selected memory cell. The word line is activated to turn on the cell selector transistor M1. With the bit line (sense node) precharged to the precharge voltage level and the source line connected to the ground potential, a cell current flows through the resistive memory element $R_{MEM}$ where the cell current has a current value indicative of the programmed resistance of the resistive memory cell.

In some cases, the resistive memory device is implemented using a voltage sense amplifier. In that case, the bit line is connected to a sense node where the voltage on the bit line or at the sense node is sensed or measured. As a result of the cell current flowing through the resistive memory element $R_{MEM}$, the sense node voltage is discharged from the precharged voltage level (curve 42). In particular, the sense node voltage decreases at a rate indicative of the programmed resistance of the resistive memory cell. When the resistive memory cell is programmed to a large resistance value (curve 44), the cell current is small and the sense node voltage decreases slowly from the precharged voltage level. When the resistive memory cell is programmed to a small resistance value (curve 46), the cell current is large and the sense node voltage decreases quickly from the precharged voltage level. The sense node voltage is allowed to develop for a given time duration and then the sense node voltage is read by a voltage sense amplifier and compared with a reference voltage (SA Ref Voltage). When the sense node voltage is greater than the sense amplifier reference voltage, the resistive memory cell is in the high resistance state. When the sense node voltage is less than the sense amplifier reference voltage, the resistive memory cell is in the low resistance state. The read out data is thus derived from the sense amplifier output comparing the sense node voltage to the reference voltage.

In other examples, the resistive memory device is implemented using a current sense amplifier. In that case, the cell current from the selected memory cell is compared with a reference current to determine the programmed resistance of the memory cell. The reference current may be generated using a set of reference resistive memory cells. The reference current has a value that is between the cell currents associated with the high resistance state and the low resistance state. The programmed resistance of the selected resistive memory cell can be discerned by comparing the cell current to the reference current. For example, when the cell current is greater than the reference current, the resistive memory cell is in the low resistance state and when the cell current is less than the reference current, the resistive memory cell is in the high resistance state.

Due to properties of the controllable resistor material being used as the resistive memory element and limitations in the fabrication process, the resistance values for the high and low resistance states are often distributed over a range and the resistance values may vary over time. Furthermore, repeated reading of the resistive memory cell may also cause the resistance values to drift. For example, when the resistive memory device is fabricated using scaled down feature size, it is increasingly difficult to fabricate resistive memory cells with uniform contact size. Thus, it is difficult to achieve a uniform write current across all the memory cells, which results in variations in the electrical characteristics of the memory cells, such as variation in the resistance values of the resistive memory element. The process variations and limitations leads to narrowing of the read sense margin of the memory cells. Narrowing of the read sense margin degrades performance and yield of the resistive memory device.

In order to read out the programmed resistance value from the memory cell accurately, a sufficiently large sense margin is needed to ensure detection of the high resistance state and the low resistance state. In the present description, the sense margin is defined as the distance between the high resistance state and the low resistance state of the resistive memory cell, which can be represented by the distance between the cell current values or the sense node voltage values for the high resistance state and the low resistance state. Referring to FIG. 4, in the ideal case, the cell current for the high resistance state will have distribution centered around the desired current value as denoted by curve 54 while the cell current for the low resistance state will have a distribution centered around the desired current value as denoted by curve 56. The ideal cell currents for the high and low resistance states will have a sufficiently large current difference value to provide a sufficiently large sense margin between the logic values represented by the resistance values. However, due to fabrication process variations, limitations of the controllable resistor material, or repeated read operations, the programmed resistance values tend to drift from the ideal values over time. This is particularly problematic as the high and low resistance values, or high and low cell current values, tend to converge, reducing the sense margin which reduces the read data accuracy. Referring to FIG. 3, when the programmed resistance values converges, the sense node voltage values between the high resistance state and the small resistance state also converge, reducing the available sense margin and reducing the read data accuracy.

In particular, repeated write and read operation of resistive memory cells in a resistive memory device may degrade the memory cells and disturb the stored data. For example, repeated reading of a memory cell may cause the cell resistances to vary. In some cases, the memory cell resistance may be disturbed so that the memory cell no longer retains the original stored data value. Cell disturb during read operation occurs in a resistive memory device because the read operation and write operation for the low resistance state have similar bias conditions. To write a low resistance state to a resistive memory cell, the source line is connected to the ground potential while the bit line is driven to a write voltage having a positive voltage value, such as 2V. To read from the resistive memory cell, the source line is also connected to the ground potential while the bit line is driven to the precharge voltage having a positive voltage value, such as 1V. The precharge voltage is typically lower than the write voltage. Thus, even though the precharge voltage is not high enough to overwrite the programmed resistance in the memory cell, repeated reading of the memory cell may cause the programmed resistance value to change, which may result in reduced sense margin. When the sense margin of a resistive memory cell becomes too narrow, the sense amplifier may detect the wrong data value from the memory cell.

Because of the cell disturb issue, even though resistive memory cells are non-volatile memory, the memory cells may need to be refreshed to maintain the stored data values. Conventional resistive memory devices often perform blanket refresh of all memory cells, or all memory cells in a unit, by monitoring one or more monitor memory cells. Blanket refresh of memory cells is undesirable as all memory cells are refreshed regardless of any changes in the cell resistance values. When blanket refresh is performed, all memory cells, including memory cells that do not require refreshing, are subjected to the re-write operation. Repeated writing of a resistive memory cell may damage a healthy memory cell by over-writing.

In embodiments of the present invention, the resistive memory device incorporates a selective refresh circuit to implement a selective refresh method to perform selective refresh during the read operation where only memory cells with reduced sense margin are subjected to the refresh operation. In this manner, the selective refresh circuit and method guardbands the sense margin of the resistive memory device so that accurate and reliable read out operation can be guaranteed. In embodiments of the present invention, the selective refresh circuit and method is implemented in a resistive memory device using a voltage sense amplifier for the read operations. That is, the sense amplifier compares the sense node voltage developed from a cell current of a selected resistive memory cell to a reference voltage. In the present embodiment, the low resistance state of the resistive memory cell is assigned to the logical low value (logical "0") while the high resistance state of the resistive memory cell is assigned to the logical high value (logical "1"). The high and low logical value assignment is illustrative only and not intended to be limiting. The resistive memory device may be configured to use the opposite logical states and the selective refresh circuit and method can be adapted by reversing the polarities of the appropriate voltages and logical states.

Figure 5:
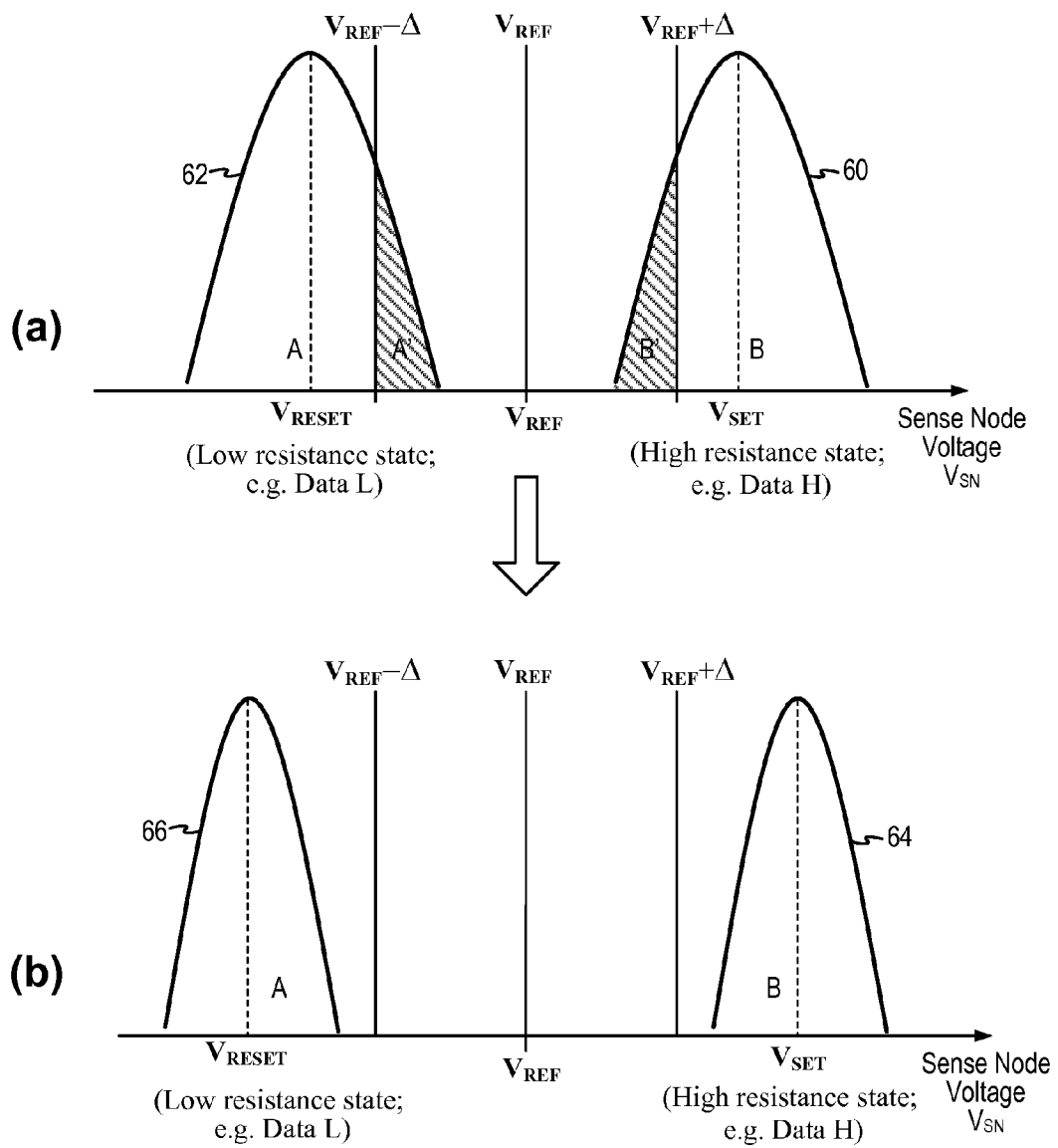
FIG. 5, which includes

FIG. 5, which includes FIG. 5(a) and FIG. 5(b), is a plot of the sense node voltage distribution for high and low resistance states in a resistive memory device implementing the selective refresh method in some embodiments of the present invention. Referring first to FIG. 5(a), in operation, the resistive memory cells in the resistive memory device will have a distribution of resistance values so that the sense node voltage $V_{SN}$ for the high resistance state and the low resistance state will also have a distribution about their ideal or mean values. That is, the sense node voltage for the high resistance state will have distribution centered around the desired voltage value $V_{SET}$ as denoted by curve 60 while the sense node voltage for the low resistance state will have distribution centered around the desired voltage value $V_{RESET}$ as denoted by curve 62. The sense voltage for the high and low resistance states will have a sufficiently large voltage difference value to provide a sufficiently large sense margin between the logic values represented by the high and low resistance values.

In the present embodiment, the resistive memory device uses a voltage sense amplifier for the read operation. Accordingly, the voltage sense amplifier receives a reference voltage $V_{REF}$ to which the sense node voltage is compared. When the sense node voltage $V_{SN}$ is greater than the reference voltage $V_{REF}$, the sense amplifier will generate a logical high data output, which is indicative of the high resistance state. When the sense node voltage $V_{SN}$ is less than the reference voltage $V_{REF}$, the sense amplifier will generate a logical low data output, which is indicative of the low resistance state. Over the course of operation of the resistance memory device, the resistance of the memory cells may be disturb and the resistance values between the high and low resistance states may converge, so that the sense node voltages for the logical high state ($V_{SET}$) and the logical low state ($V_{RESET}$) may also converge, reducing the sense margin.

In embodiments of the present invention, the selective refresh method performs a refresh determination operation at each read cycle of a resistive memory cell to assess the sense margin of the resistive memory cell. When the refresh determination operation detects a reduced sense margin for a particular resistive memory cell, then the selective refresh method will perform a re-write of the stored data in the memory cell. When the refresh determination operation detects a normal sense margin for a particular resistive memory cell, then the selective refresh method will not perform re-writing of the memory cell. The selective refresh method is performed at each read cycle in the background so that the refresh determination and refresh operation occurs automatically and transparently to improve the robustness of the stored data.

In embodiments of the present invention, the selective refresh method introduces a guardband of voltage $\Delta$ around the reference voltage $V_{REF}$. That is, guardband reference voltages $V_{REF}+\Delta$ and $V_{REF}-\Delta$ are provided to establish an outer boundary of the reference voltage $V_{REF}$. The selective refresh method uses the guardband reference voltages to detect when a memory cell has reduced sense margin. In particular, the guardband reference voltage $V_{REF}+\Delta$ is used to detect for reduced sense margin for the high resistance state (or logical high (H) state in the present embodiment). Furthermore, the guardband reference voltage $V_{REF}-\Delta$ is used to detect for reduced sense margin for the low resistance state (or logical low (L) state in the present embodiment).

Figure 6:
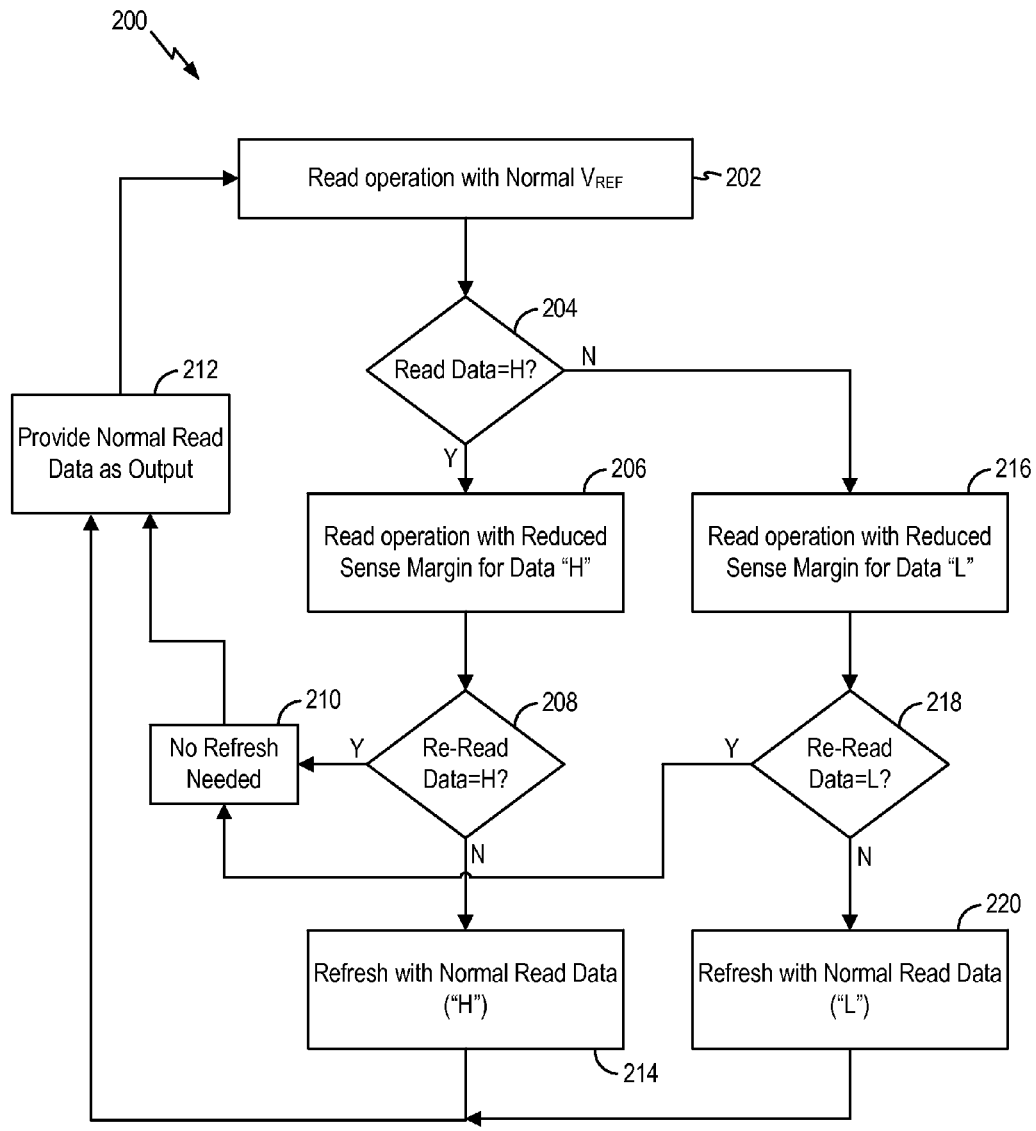
FIG. 6 is a flowchart illustrating the selective refresh method for a resistive memory device in embodiments of the present invention.

The selective refresh method of the present invention will now be described with reference to the flowchart in FIG. 6. Referring to FIG. 5(a) and FIG. 6, the selective refresh method 200 is initiated at each read operation of a resistive memory cell in the resistive memory device. At 202, the first read operation is performed using the normal reference voltage $V_{REF}$ (normal read). The method then determines if the read data using the normal reference voltage $V_{REF}$ yields a logical high or a logical low value. That is, the sense node voltage $V_{SN}$ is compared against the reference voltage $V_{REF}$ to determine if the sense node voltage $V_{SN}$ is above or below the reference voltage $V_{REF}$.

At 204, the method 200 determines if the read data from the resistive memory cell is a logical high value. If the resistive memory cell is read to have a logical high value, that is the sense node voltage $V_{SN}$ is within a region B under the curve 60, then the selective refresh method 200 re-read the memory cell using a guardband reference voltage that gives a reduced margin for data with logical high value as the sense amplifier reference voltage (206). Accordingly, the memory cell is re-read using the guardband reference voltage $V_{REF}+\Delta$ as the reference voltage to determine if the memory cell has a reduced sense margin for the logical high data value. From the re-read operation, the method 200 determines if the re-read data from the resistive memory cell is a logical high value (208). If the resistive memory cell is read to have a logical high value again, then the memory cell has sufficient sense margin and no refresh is needed (210). The read data (logical high) from the normal read operation can be latched and provided as the output data (212).

On the other hand, during the re-read operation (208), if the resistive memory cell is read to have a logical low value, then the resistance value of the memory cell has degraded so that the sense node voltage is now within a region B' under curve 60. In that case, the selective refresh method 200 determines that the logical high sense margin for the memory cell has reduced and the method performs a refresh of the memory cell using the normal read data (logical high) (214). The read data (logical high) from the normal read operation can be latched and provided as the output data (212).

Meanwhile, at 204, the method 200 may determine that the read data from the resistive memory cell is not a logical high value, that is, the read data is a logical low value. When a resistive memory cell is read to have a logical low value, that is the sense node voltage is within a region A under the curve 62 and, the selective refresh method 200 re-reads the memory cell using a guardband reference voltage that gives a reduced margin for data with logical low value as the sense amplifier reference voltage (216). Accordingly, the memory cell is re-read using the guardband reference voltage $V_{REF}-\Delta$ as the reference voltage to determine if the memory cell has a reduced sense margin for the logical low data value. From the re-read operation, the method 200 determines if the re-read data from the resistive memory cell is a logical low value (218). If the resistive memory cell is read to have a logical low value again, then the memory cell has sufficient sense margin and no refresh is needed (210). The read data (logical low) from the normal read operation can be latched and provided as the output data (212).

On the other hand, during the re-read operation (218), if the resistive memory cell is read to have a logical high value, then the resistance value of the memory cell has degraded so that the sense node voltage is now within a region A' under curve 62. In that case, the selective refresh method 200 determines that the logical low sense margin for the memory cell has reduced and the method performs a refresh of the memory cell using the normal read data (logical low) (220). The read data (logical low) from the normal read operation can be latched and provided as the output data (212).

Accordingly, during a read operation, if the sense node voltage $V_{SN}$ read out of a resistive memory cell is in the region A' or B', then the selective refresh method will perform a refresh, or re-write, of the resistive memory cell to restore the programmed resistance of the memory cell. If the sense node voltage $V_{SN}$ read out of a resistive memory cell is outside of the region A' or B', then the selective refresh method will not perform a refresh as refresh is not necessary for the memory cell. FIG. 5(b) illustrates the sense node voltage distribution profile after the refresh operation. The selective refresh method extends the sense margin of the resistive memory device. In particular, the sense margin between the low resistance state and the high resistance state is now maintained beyond the guardband reference voltages. Furthermore, the distribution profile of the resistance memory device may be widened over time due to disturbances (FIG. 5(a)). The selective refresh method of the present invention recovers the distribution profile so that the sense node voltage distribution now have a narrower voltage distribution about the high resistance state ($V_{SET}$) and the low resistance state ($V_{RESET}$) (FIG. 5(b)). The resistive memory device can maintain the sense node voltage distribution of FIG. 5(b) as the selective refresh method is performed at every read operation.

In the above described method, a resistive memory cell selected for access is read first with the normal reference voltage $V_{REF}$ (normal read) and then is re-read again using a guardbanded reference voltage $V_{REF} \pm \Delta$ for reduced sense margin (reduced margin read). In other embodiments of the present invention, the normal read operation and the reduced margin read operation can actually be carried out simultaneously. The selective refresh method can determine if the two read operations yield the same read data output. When the two read operations yield the same read data output, then the memory cell has sufficient sense margin. When the two read operations yield different read data output, then the memory cell has reduced sense margin and needs to be refreshed. The selective refresh method with concurrent read operations will be described in more details below with reference to FIGS. 7 and 8.

Figure 7:
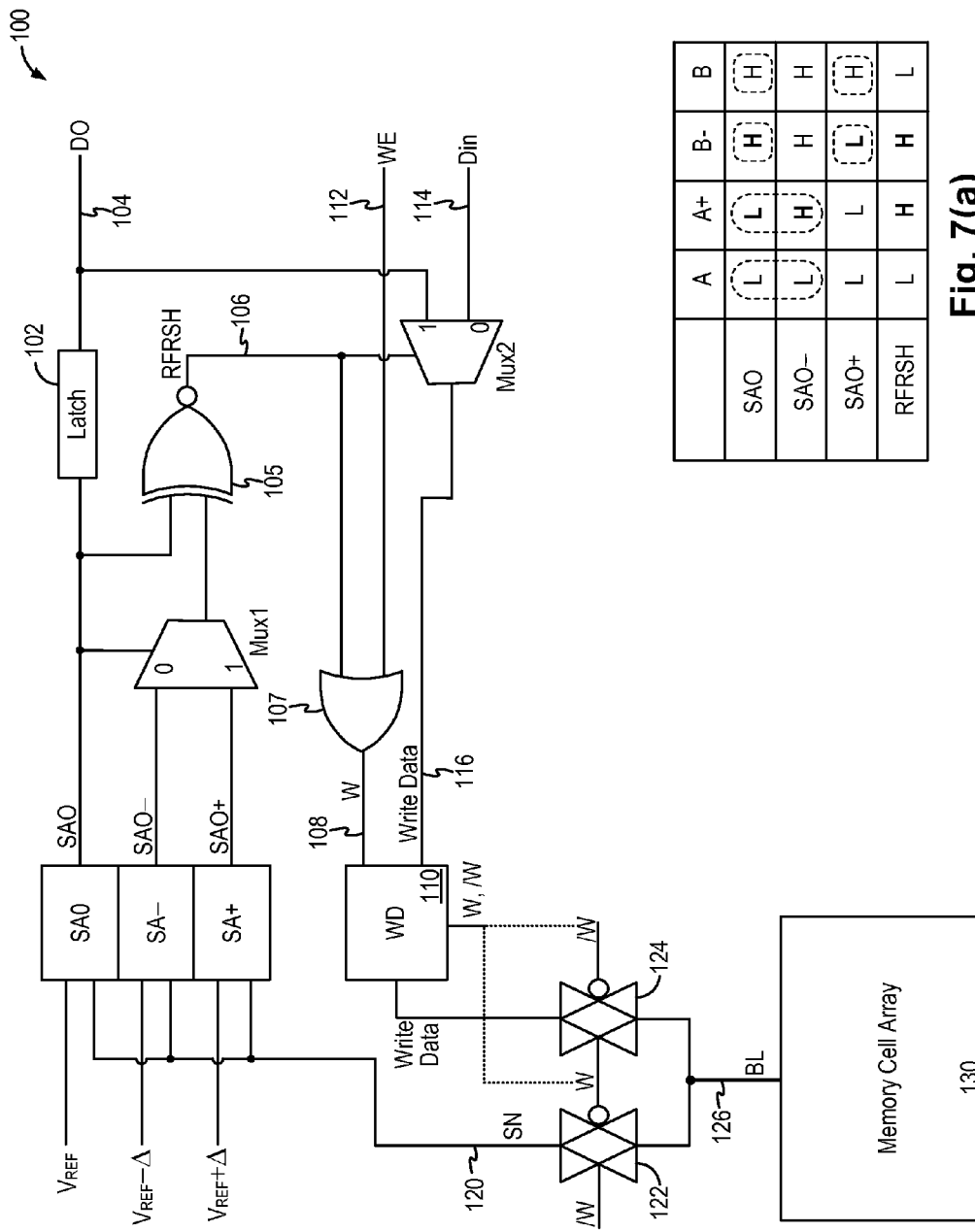
FIG. 7, which includes

FIG. 7 is a schematic diagram of a resistive memory device incorporating a selective refresh circuit in embodiments of the present invention. Referring to FIG. 7, the resistive memory device includes a memory cell array 130 of resistive memory cells. When a resistive memory cell is selected for access, the word line and bit line to the memory cell is activated. The bit line 126 carries the cell current from the selected memory cell. A selector switch 122 is turned on during the read operation to connect the bit line 126 to a sense node (SN) 120. A sense node voltage $V_{SN}$ is developed at the sense node 120. The sense node voltage is a function of the cell current which is a function of the programmed resistance of the selected memory cell. On the other hand, when a write operation is to be performed to the selected memory cell, the selector switch 122 is turned off and the selector switch 124 is turned on to allow a write driver 110 to drive write data onto the bit line 126. The selector switches 122 and 124 are controlled by a write signal W and its inverse /W. When the write signal is asserted (e.g. logical high) to perform a write operation, the selector switch 124 is turned on and the selector switch 122 is turned off. When the write signal is deasserted (e.g. logical low) to perform a read operation, the selector switch 122 is turned on and the selector switch 124 is turned off.

In embodiments of the present invention, the resistive memory device includes a selective refresh circuit 100 to facilitate the normal read operation and also to make the refresh determination for each read operation. The selective refresh circuit 100 includes a bank of three sense amplifiers SA0, SA– and SA+. Each sense amplifier has a first input terminal coupled to the sense node (SN) 120 to receive the sense node voltage. Each sense amplifier has a second input terminal coupled to receive a respective reference voltage for comparison. More specifically, sense amplifier SA0 is coupled to receive the normal reference voltage $V_{REF}$ and provides a sense amplifier output signal SAO. Sense amplifier SA0 is used for the normal read operation to generate a normal read data SAO based on the reference voltage $V_{REF}$. The normal read data SAO may be latched by a latch 102 and then provided as the read out data DO (node 104). Sense amplifier SA– is coupled to receive the reference voltage $V_{REF}–\Delta$ related to a reduced sense margin for the logical low value and provides a sense amplifier output signal SAO–. Sense amplifier SA+ is coupled to receive the reference voltage $V_{REF}+\Delta$ related to a reduced sense margin for the logical high value and provides a sense amplifier output signal SAO+. Sense amplifiers SA– and amplifier SA+ form two guardband sense amplifiers for determining if a memory cell has reduced sense margin.

As thus configured, the three sense amplifiers perform the read operation concurrently using their respective reference voltages. Depending on the logical value of the normal read data SAO, one sense amplifier output signal from the two guardband sense amplifiers will be selected for the refresh determination. More specifically, the sense amplifier output signals SAO– and SAO+ are coupled to the input terminals of a multiplexer Mux1. The normal read data SAO is coupled to the select terminal of the multiplexer Mux1. When the normal read data SAO is a logical low value, the multiplexer Mux1 will select the sense amplifier output SAO– corresponding to the guardband sense amplifier for reduced sense margin for logical low data value. When the normal read data SAO is a logical high value, the multiplexer Mux1 will select the sense amplifier output SAO+ corresponding to the guardband sense amplifier for reduced sense margin for logical high data value.

The normal read data SAO and the selected guardband sense amplifier output (SAO+/–) are coupled to an exclusive NOR (XNOR) gate 105. The XNOR gate 105 compares the two input signals and generates a refresh signal RFRSH (node 106) to indicate whether refresh is necessary. For example, the XNOR gate 105 generates a logical low output signal as the refresh signal RFRSH when the two input signals have the same logical value to indicate no refresh of the memory cell is needed. The XNOR gate 105 generates a logical high output signal as the refresh signal RFRSH when the two input signals have different logical values to indicate refresh of the memory is necessary.

When the refresh signal RFRSH is asserted (logical high), the selective refresh circuit 100 will then initiate a write back operation to re-write the stored data back into the memory cell to increase the sense margin of the memory cell. The refresh signal RFRSH (node 106) is first used to enable the write operation. More specifically, the refresh signal RFRSH is coupled to one input of an OR gate 107. OR gate 107 also receives the write enable (WE) signal (node 112) for performing the normal write operations. When either the write enable signal (node 112) or the refresh signal (node 106) are asserted (logical high), the write signal W (node 108) is asserted. The write signal W is coupled through the write driver 110 to control the selector switches 122 and 124 in the manner described above.

The refresh signal RFRSH (node 106) is also used to select the write back data. The refresh signal RFRSH is coupled to the control terminal of a multiplexer Mux2. The multiplexer Mux2 receives the read out data DO (node 104) from the normal read operation as one input signal and receives an input data Din (node 114) for normal write operation as the other input signal. The multiplexer Mux2 generates the write data as the output signal (node 116). When the refresh signal RFRSH is asserted (logical high), the multiplexer Mux2 selects the read out data DO as the write data (node 116). The write data is then provided to the write driver 110 to be provided to the selector switch 124 and be written back to the memory cell through the bitline 126. In this manner, the normal read data DO, being the stored data of the selected memory cell, is coupled back to the write driver for the write back operation to the memory cell.

FIG. 7 includes an insert FIG. 7(a) illustrating the logical table for the selective refresh circuit. As shown in FIG. 7(a), when the memory cell read out data have the same logical value (L or H) for the normal read (SAO) and for the reduced margin read (SAO− or SAO+), the refresh signal is not asserted (logical L). However, when the memory cell read out data have different logical values (L and H) for the normal read (SAO) and for the reduced margin read (SAO− or SAO+), the refresh signal is asserted (logical H).

Figure 8:
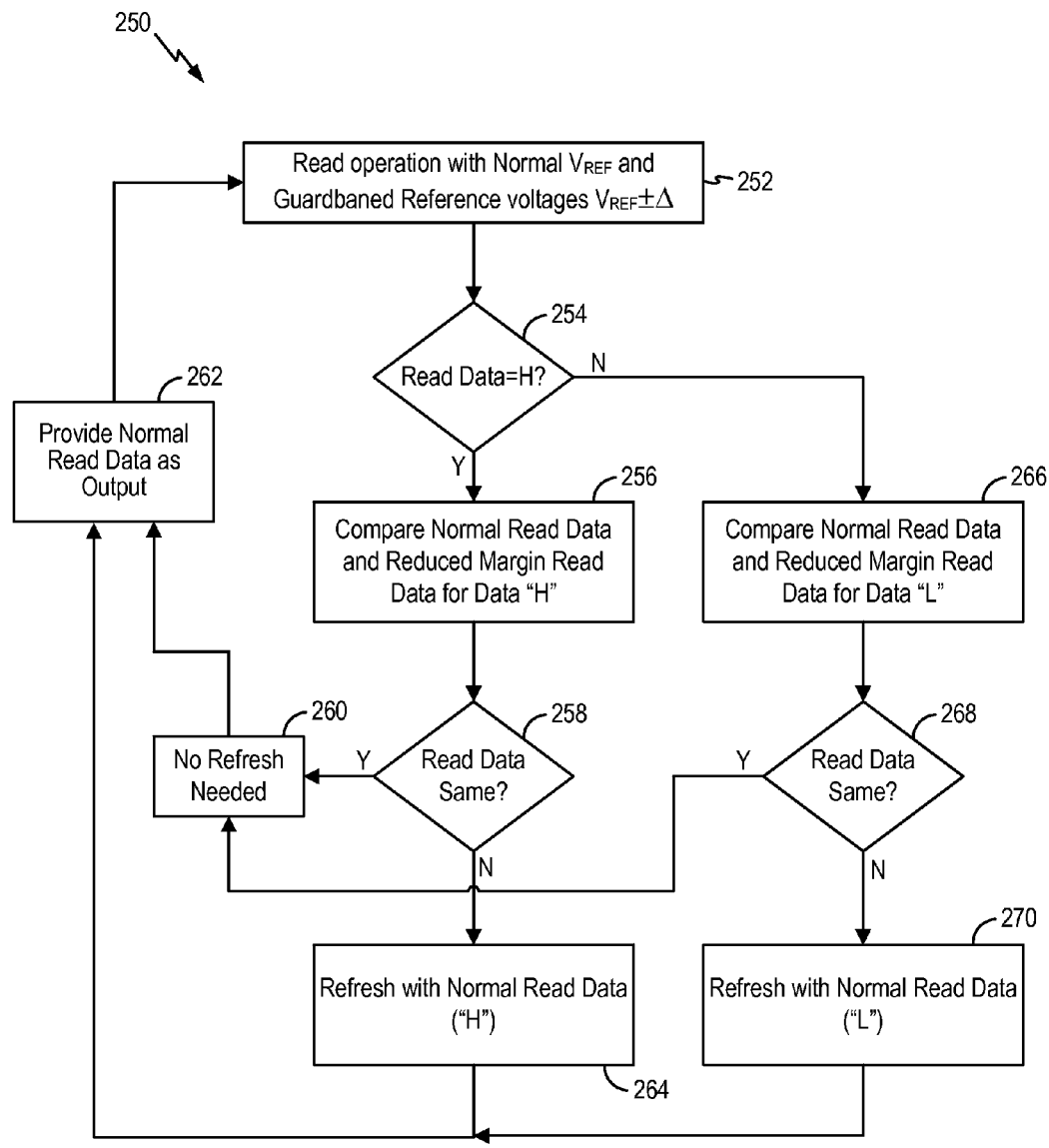
FIG. 8 is a flowchart illustrating the selective refresh method for a resistive memory device in alternate embodiments of the present invention.

The operation of the selective refresh circuit of FIG. 7 will be described with reference to the flow chart in FIG. 8. FIG. 8 is a flowchart illustrating the selective refresh method for a resistive memory device in alternate embodiments of the present invention. Referring to FIG. 8, a selective refresh method 250 performs read operations using the normal reference voltage $V_{REF}$ and the guardband reference voltages $V_{REF} \pm \Delta$ (252). The selective refresh method 250 then determines if the read data from the normal reference voltage $V_{REF}$ (normal read) is a logical high value (254). When the normal read data has a logical high value, the method 250 compares the normal read data with the read data for reduced sense margin for the logical high value (256). When the two read data are the same (258), then no refresh is needed (260) and the normal read out data can be provided as output (262). When the two read data are different (258), the method 250 determines that a refresh is needed and performs a refresh operation by writing back the normal read data (logical high) (264). The normal read out data can be provided as output (262).

On the other hand, when the selective refresh method 250 determines that the read data from the normal reference voltage $V_{REF}$ (normal read) is a logical low value (254), the method 250 compares the normal read data with the read data for reduced sense margin for the logical low value (266). When the two read data are the same (268), then no refresh is needed (260) and the normal read out data can be provided as output (262). When the two read data are different (268), the method 250 determines that a refresh is needed and performs a refresh operation by writing back the normal read data (logical low) (270). The normal read out data can be provided as output (262).

Figure 9:
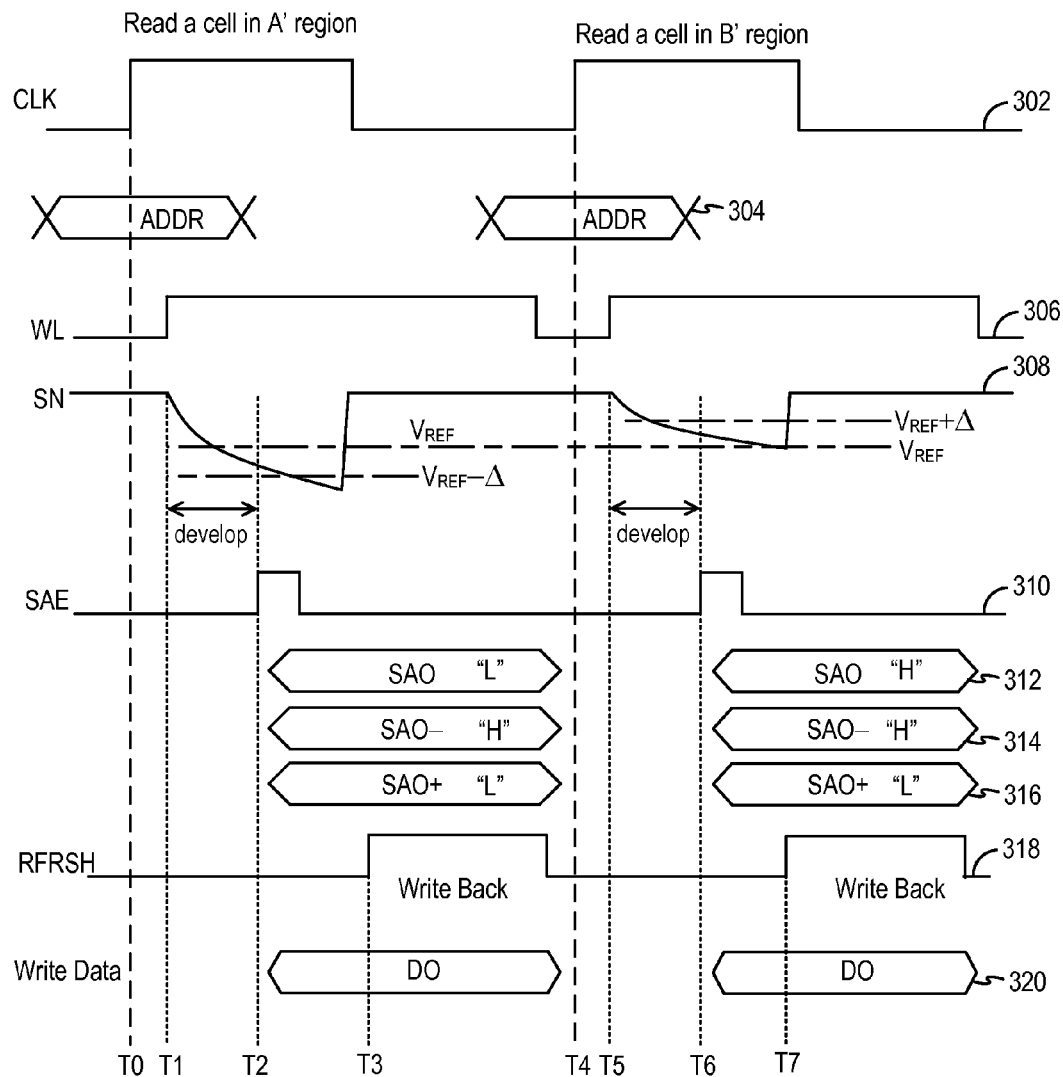
FIG. 9 is a timing diagram illustrating the operation of the selective refresh circuit and method in embodiments of the present invention.

FIG. 9 is a timing diagram illustrating the operation of the selective refresh circuit and method in embodiments of the present invention. More specifically, FIG. 9 illustrates the reading of a memory cell with a sense node voltage in the A' region and another memory cell with a sense node voltage in the B' region. Referring to FIG. 9, at time T0, a clock signal (curve 302) is asserted when a read operation is initiated. The cell address ADDR (curve 304) is provided. Then, at time T1, the word line WL (curve 306) for the selected memory cell is asserted. With the memory cell thus accessed, the sense node voltage (curve 308) starts to develop as a function of the cell current which is a function of the programmed resistance of the memory cell. In particular, the sense node voltage was precharged and when the memory cell is selected for access, the sense node voltage starts to decrease as a function the cell resistance.

At time T2, the sense amplifier enable signal SAE (curve 310) is asserted and the three sense amplifiers SA0, SA− and SA+ are activated to read the sense node voltage. In the present example, the sense node voltage has a voltage value between the normal reference voltage $V_{REF}$ and the guardband reference voltage $V_{REF} - \Delta$. That is, the sense node voltage is below the normal reference voltage $V_{REF}$, indicating a normal read data SAO (curve 312) of logical low value but the sense node voltage is above the guardband reference voltage $V_{REF} - \Delta$, indicating a reduced margin read data SAO− (curve 314) of logical high value. With the normal read data SAO being a logical low value but the reduced sense margin read data SAO− being a logical high value, the memory cell is determined to have a reduced sense margin. The refresh signal RFRSH (curve 318) is thus asserted at time T3 to start a write back operation. The normal read data DO (curve 320) is provided as the write data for the write back operation.

In another example, at time T4, the clock signal (curve 302) is asserted when a read operation is initiated. The cell address ADDR (curve 304) is provided. Then, at time T5, the word line WL (curve 306) for the selected memory cell is asserted. With the memory cell thus accessed, the sense node voltage (curve 308) starts to develop as a function of the cell current which is a function of the programmed resistance of the memory cell. At time T6, the sense amplifier enable signal SAE (curve 310) is asserted and the three sense amplifiers SA0, SA− and SA+ are activated to read the sense node voltage. In the present example, the sense node voltage has a voltage value between the normal reference voltage $V_{REF}$ and the guardband reference voltage $V_{REF} + \Delta$. That is, the sense node voltage is above the normal reference voltage $V_{REF}$, indicating a normal read data SAO (curve 312) of logical high value but the sense node voltage is below the guardband reference voltage $V_{REF} + \Delta$, indicating a reduced margin read data SAO+ (curve 316) of logical low value. With the normal read data being a logical high value but the reduced sense margin read data SAO+ being a logical low value, the memory cell is determined to have a reduced sense margin. The refresh signal RFRSH (curve 318) is thus asserted at time T7 to start a write back operation. The normal read data DO (curve 320) is provided as the write data for the write back operation.

Figure 10:
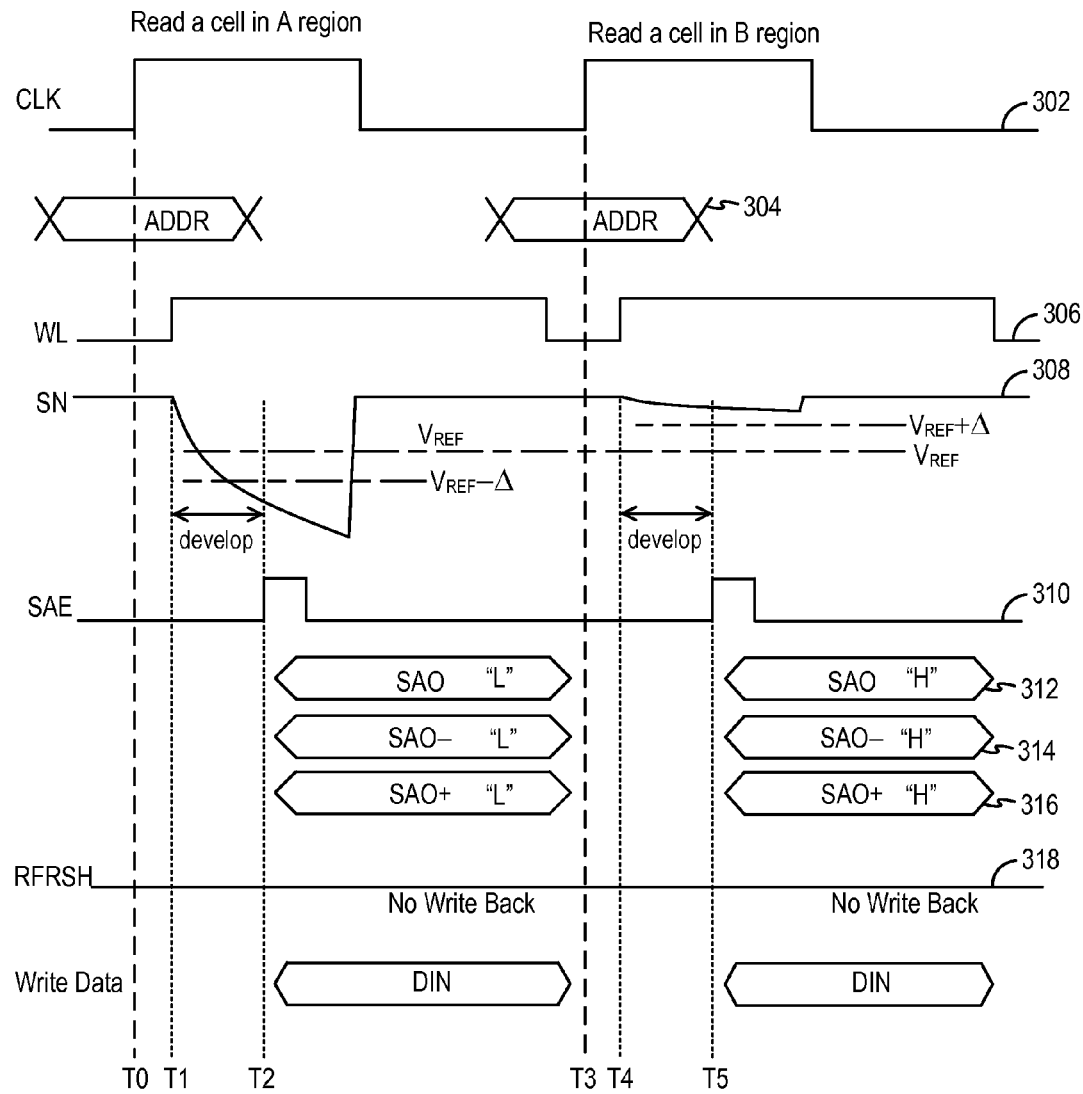
FIG. 10 is a timing diagram illustrating the operation of the selective refresh circuit and method in other embodiments of the present invention.

FIG. 10 is a timing diagram illustrating the operation of the selective refresh circuit and method in other embodiments of the present invention. More specifically, FIG. 10 illustrates the reading of a memory cell with a sense node voltage in the A region and another memory cell with a sense node voltage in the B region. Referring to FIG. 10, at time T0, a clock signal (curve 302) is asserted when a read operation is initiated. The cell address ADDR (curve 304) is provided. Then, at time T1, the word line WL (curve 306) for the selected memory cell is asserted. With the memory cell thus accessed, the sense node voltage (curve 308) starts to develop as a function of the cell current which is a function of the programmed resistance of the memory cell. In particular, the sense node voltage was precharged and when the memory cell is selected for access, the sense node voltage starts to decrease as a function the cell resistance.

At time T2, the sense amplifier enable signal SAE (curve 310) is asserted and the three sense amplifiers SA0, SA− and SA+ are activated to read the sense node voltage. In the present example, the sense node voltage has a voltage value below the normal reference voltage $V_{REF}$ and also below the guardband reference voltage $V_{REF}-\Delta$, indicating a normal read data SAO (curve 312) of logical low value and also a reduced margin read data SAO− (curve 314) of logical low value. With the normal read data SAO and the reduced sense margin read data SAO− having the same logical value, no refresh is needed and the refresh signal RFRSH (curve 318) is not asserted. No write back operation is performed.

In another example, at time T3, the clock signal (curve 302) is asserted when a read operation is initiated. The cell address ADDR (curve 304) is provided. Then, at time T4, the word line WL (curve 306) for the selected memory cell is asserted. With the memory cell thus accessed, the sense node voltage (curve 308) starts to develop as a function of the cell current which is a function of the programmed resistance of the memory cell. At time T5, the sense amplifier enable signal SAE (curve 310) is asserted and the three sense amplifiers SA0, SA− and SA+ are activated to read the sense node voltage. In the present example, the sense node voltage has a voltage value that is above the normal reference voltage $V_{REF}$ and above the guardband reference voltage $V_{REF}+\Delta$, indicating a normal read data SAO (curve 312) of logical high value and also a reduced margin read data SAO+ (curve 316) of logical high value. With the normal read data SAO and the reduced sense margin read data SAO+ having the same logical value, no refresh is needed and the refresh signal RFRSH (curve 318) is not asserted. No write back operation is performed.

In the above described embodiments, the resistive memory device is implemented using voltage sense amplifiers. The selective refresh method implements voltage guardbanding for the reference voltage to increase the sense margin and improve the robustness of the stored memory data. In other embodiments, the selective refresh method can be implemented in a resistive memory device using current sense amplifier where the cell current of the memory cells is read and compared against a reference current. The selective refresh method can implement current guardbanding of the reference current of the current sense amplifier. The use of voltage guardbanding in the above description is illustrative only and not intended to be limiting. In general, the programmed resistance of a memory cell can be read as a sense signal which is compared to a reference signal. The sense signal and the reference signal can be a current value or a voltage value.

In the above described embodiments, an exclusive NOR gate is used to compare the normal read data and the re-read data. In other embodiments, a comparator circuit can be used to compare the normal read data and the re-read data. In fact, any comparing circuit can be used to compare the two read data.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method in a resistive memory device, the resistive memory device including a two-dimensional array of resistive memory cells, each memory cell being accessed by a word line, a bit line and a source line, the method comprising:
   selecting a memory cell for read operation;
   generating a sense signal indicative of a programmed resistance value of the selected memory cell;
   comparing the sense signal to a first reference signal to generate a first read signal having a first logical state;
   comparing the sense signal to a second reference signal to generate a second read signal having a second logical state, the first reference signal having a first sense margin and the second reference signal having a second sense margin, the second sense margin being a reduced sense margin as compared to the first sense margin for the first logical state of the first read signal;
   in response to the first read signal and the second read signal having different logical states, writing the logical state of the first read signal to the selected memory cell; and
   providing the first read signal as the output signal of the read operation.

2. The method of claim 1, further comprising:
   in response to the first read signal and the second read signal having the same logical state, providing the first read signal as the output signal of the read operation without writing back of the first read signal.

3. The method of claim 1, wherein each of the resistive memory cells is configured to store programmed resistance values associated with a logical state for a logical high value and a logical state for a logical low value, the difference between the sense signal associated with the logical state for a logical high value and the sense signal associated with the logical state for a logical low value forming the sense margin of the resistive memory cell.

4. The method of claim 1, wherein the sense signal comprises a sense node voltage, the first reference signal comprises a first reference voltage, and the second reference voltage comprises a reference voltage with the reduced sense margin as compared to the first reference voltage for the first logical state of the first read signal, the method comprises:
   generating the sense node voltage indicative of the programmed resistance value of the selected memory cell;
   comparing the sense node voltage to the first reference voltage to generate the first read signal having the first logical state; and
   comparing the sense node voltage to the second reference voltage to generate the second read signal having the second logical state.

5. The method of claim 4, wherein comparing the sense node voltage to the first reference voltage to generate the first read signal having the first logical state comprises:
   generating the first read signal having a logical state for a logical low value in response to the sense node voltage being less than the first reference voltage; and
   generating the first read signal having a logical state for a logical high value in response to the sense node voltage being greater than the first reference voltage.

6. The method of claim 5, wherein comparing the sense node voltage to the second reference voltage to generate the second read signal having the second logical state comprises:
   in response to the first read signal having the logical state for a logical low value, comparing the sense node voltage to the second reference voltage to generate second read signal having the second logical state, the second reference voltage being less than the first reference voltage; and in response to the first read signal having the logical state for a logical high value, comparing the sense node voltage to the second reference voltage to generate second read signal having the second logical state, the second reference voltage being greater than the first reference voltage.

7. The method of claim 5, wherein the first logical state comprises a logical low state and the second logical state comprises a logical high state.

* * * * *